(12) United States Patent
Chae et al.

(10) Patent No.: US 9,666,524 B2
(45) Date of Patent: May 30, 2017

(54) ELECTRO-MIGRATION ENHANCING METHOD FOR SELF-FORMING BARRIER PROCESS IN COPPER METTALIZATION

(71) Applicant: GLOBALFOUNDRIES Inc., Grand Cayman (KY)

(72) Inventors: Moosung Chae, Englewood Cliffs, NJ (US); Larry Zhao, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/098,513

(22) Filed: Apr. 14, 2016

(65) Prior Publication Data

US 2016/0225712 A1    Aug. 4, 2016

Related U.S. Application Data

(62) Division of application No. 14/059,498, filed on Oct. 22, 2013, now Pat. No. 9,362,228.

(51) Int. Cl.
| | | |
|---|---|---|
| *H01L 23/535* | (2006.01) | |
| *H01L 23/522* | (2006.01) | |
| *H01L 23/532* | (2006.01) | |
| *H01L 21/768* | (2006.01) | |

(52) U.S. Cl.
CPC .... *H01L 23/5226* (2013.01); *H01L 21/76805* (2013.01); *H01L 21/76831* (2013.01); *H01L 21/76843* (2013.01); *H01L 21/76846* (2013.01); *H01L 21/76855* (2013.01); *H01L 23/53238* (2013.01); *H01L 23/53295* (2013.01); *H01L 2924/0002* (2013.01)

(58) Field of Classification Search
None
See application file for complete search history.

(56) References Cited

U.S. PATENT DOCUMENTS

| | | |
|---|---|---|
| 2009/0117731 A1 | 5/2009 | Yu et al. |
| 2009/0209099 A1 | 8/2009 | Yu et al. |
| 2009/0263965 A1* | 10/2009 | Gordon ................ C23C 16/16 438/643 |
| 2011/0163062 A1 | 7/2011 | Gordon et al. |
| 2011/0298062 A1 | 12/2011 | Ganguli et al. |
| 2012/0228774 A1 | 9/2012 | Furuhashi et al. |
| 2013/0273733 A1 | 10/2013 | Tang et al. |

\* cited by examiner

*Primary Examiner* — Marc Armand
*Assistant Examiner* — Sarah Salerno
(74) *Attorney, Agent, or Firm* — Ditthavong & Steiner, P.C.

(57) ABSTRACT

A method of forming a barrier on both the sidewalls and bottom of a via and the resulting device are provided. Embodiments include forming a metal line in a substrate; forming a Si-based insulating layer over the metal line and the substrate; forming a via in the Si-based insulating layer down to the metal line; forming a dual-layer Mn/MnN on sidewalls and a bottom surface of the via; and filling the via with metal.

20 Claims, 7 Drawing Sheets

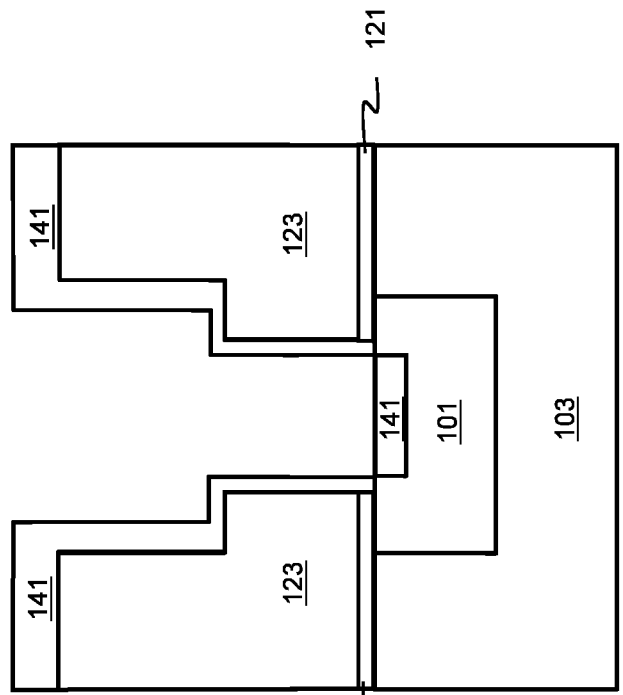
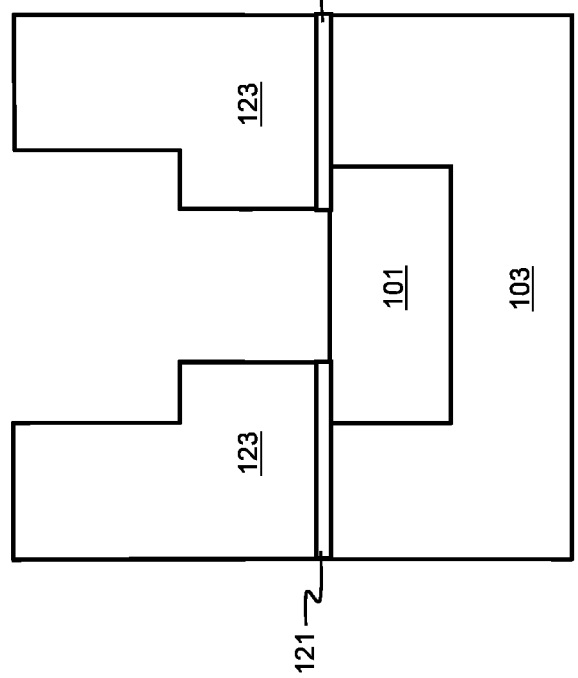
FIG. 1D
Background Art
FIG. 1C
Background Art

ELECTRO-MIGRATION ENHANCING METHOD FOR SELF-FORMING BARRIER PROCESS IN COPPER METTALIZATION

CROSS-REFERENCE TO RELATED APPLICATION

This application is a Divisional of U.S. application Ser. No. 14/059,498, filed Oct. 22, 2013, the content of which is incorporated herein by reference in its entirety.

TECHNICAL FIELD

The present disclosure relates to semiconductor interconnection. The present disclosure is particularly applicable to formation of diffusion barriers in the semiconductor interconnection.

BACKGROUND

Copper is a well-known material for wiring of microelectronic devices. Diffusion barriers prevent diffusion of copper, oxygen ($O_2$), and water ($H_2O$), for example, into silica surfaces of the microelectronic devices. In a recent industry trend, Manganese silicate ($MnSiO_x$) is a newly introduced self-forming barrier (SFB) to replace conventional diffusion barriers.

A known approach of SFB involves a self-forming barrier process by chemical vapor deposition (CVD) of manganese (Mn), wherein the Mn diffuses into a silicon-based (Si-based) insulating layer to form a $MnSiO_x$ barrier on the sidewalls of a via, as illustrated in FIGS. 1A through 1F. In particular, a metal line 101, e.g., of copper, is formed in a substrate 103. Next, a capping layer 121, e.g., silicon nitride (SiN), is formed on the substrate 103, as depicted in FIG. 1B. Then, a Si-based insulating layer 123 is formed on the capping layer 121. Adverting to FIG. 1C, a via is formed in the Si-based insulating layer 123 down to the metal line 101. Thereafter, a Mn layer 141 is formed on the sidewalls of the Si-based insulating layer 123 and metal line 101 using CVD, as illustrated in FIG. 1D. Adverting to FIG. 1E, as a result of a sufficiently high deposition temperature or thermal annealing, the Mn barrier 141 reacts with the Si-based insulating layer 123 to form a $MnSiO_x$ barrier 143 on the sidewalls of the via. However, the Mn layer 141 on the bottom of the via does not similarly react with the metal line 101. Thereafter, the via is filled with a metal 161, e.g., copper, as illustrated in FIG. 1F. The absence of a $MnSiO_x$ barrier on the bottom of the via causes a degradation of device reliability due, for example, to elecromigration.

A need therefore exists for methodology enabling formation of a self-forming barrier that protects both the sidewalls and bottom of a via against unwanted diffusion and/or electromigration, and the resulting device.

SUMMARY

An aspect of the present disclosure is a method of forming a dual-layer of Mn/MnN on the sidewalls and bottom of a via in situ by an ALD process.

Another aspect of the present disclosure is a device including a dual-layer of Mn/MnN formed on the sidewalls and bottom of a via.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a metal line in a substrate; forming a Si-based insulating layer over the metal line and the substrate; forming a via in the Si-based insulating layer down to the metal line; forming a dual-layer of Mn/MnN on sidewalls and a bottom surface of the via; and filling the via with metal.

Aspects of the present disclosure include forming the dual-layer in situ by an ALD process in an ALD chamber or by a chemical vapor deposition (CVD) process in a CVD chamber. Other aspects include forming the dual-layer by depositing Mn in the ALD chamber; and adding nitrogen-containing (N-containing) gas to the chamber during the ALD process. Further aspects include using N-containing gases such as nitrogen gas ($N_2$) or ammonia ($NH_3$). Another aspect includes forming the dual-layer at a temperature of 200° C. to 450° C. Other aspects include forming the dual-layer at a pressure of 0.1 Torr to 10 Torr. Further aspects include forming the Si-based dielectric layer of silicon oxide ($SiO_2$) or an ultra-low-k (ULK) dielectric material. Additional aspects include the Mn layer reacting with the $SiO_2$ or ULK dielectric material at the sidewalls of the via to form $MnSiO_x$ to a thickness of 3 Å to 30 Å, and forming the MnN layer to a thickness of 3 Å to 30 Å on the $MnSiO_x$ and on the Mn layer on the bottom surface of the via. Other aspects include performing a thermal anneal, wherein the Mn reacts with the Si-based insulating layer at the sidewalls to form the $MnSiO_x$ barrier layer. Further aspects include forming a capping layer over the metal line and substrate prior to forming the Si-based dielectric, and forming the via through the capping layer.

Another aspect of the present disclosure is a device including: a metal line in a substrate; a Si-based insulating layer on the substrate and the metal line; a via formed through the Si-based insulating layer down to the metal line; a Mn layer formed on the metal line at a bottom surface of the via; a $MnSiO_x$ layer formed on sidewalls of the via; and a MnN layer formed on the $MnSiO_x$ and Mn layers; and a metal filling the via. Aspects of the device include the $MnSiO_x$ layer being formed to a thickness of 3 Å to 30 Å. Other aspects include the MnN layer being formed to a thickness of 3 Å to 30 Å. Further aspects include the Si-based dielectric being formed of $SiO_2$ or a ULK dielectric material. Further aspects include a capping layer formed on the substrate under the Si-based dielectric. Another aspect includes the capping layer being formed of silicon nitride (SiN), metal cap, cobalt (Co), or cobalt/tungsten/aluminum (CoWAl). Other aspects include the metal filling the via being formed of copper.

Another aspect of the present disclosure is a method including: forming a metal line in a substrate; forming a Si-based insulating layer over the metal line and the substrate; forming a via in the Si-based insulating layer down to the metal line; depositing Mn on sidewalls and a bottom surface of the via by ALD in an ALD chamber or by a chemical vapor deposition (CVD) process in a CVD chamber; adding a N-containing gas to the ALD chamber during the ALD deposition to form a MnN layer to a thickness of 3 Å to 30 Å on the sidewalls and bottom surface of the via; and performing a thermal anneal, wherein the Mn reacts with the Si-based insulating layer at the sidewalls of the via to form a $MnSiO_x$ barrier layer to a thickness of 3 Å to 30 Å. Other aspects include using N-containing gases such as N₂ or NH₃. Further aspects include forming the Si-based insulating layer of SiO₂ or an ULK dielectric material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1F schematically illustrate sequential steps of a background method of a self-forming barrier process using CVD of Mn.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of device reliability degradation, e.g., electromigration, attendant upon current self-forming barrier processes, e.g., CVD of Mn, wherein a $MnSiO_x$ barrier ultimately forms on sidewalls of a via, but does not form in the bottom of the via. By forming a dual layer of Mn/MnN in the via, a barrier is formed on all surfaces of the via, including the bottom surface.

Methodology in accordance with embodiments of the present disclosure includes forming a metal line in a substrate. A Si-based insulating layer is formed over the metal line and the substrate. A via is formed in the Si-based insulating layer down to the metal line. A dual-layer of Mn/MnN is formed on sidewalls and a bottom surface of the via. The via is filled with metal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
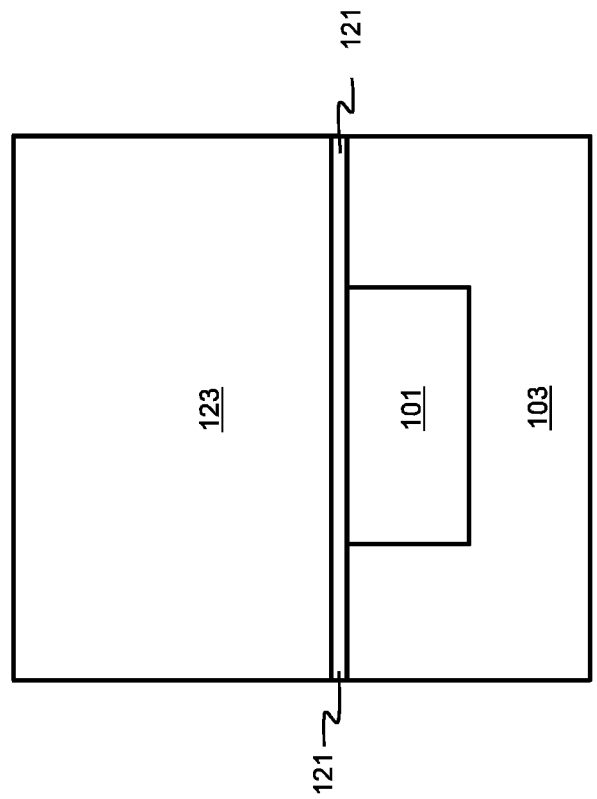
Figure 1A:
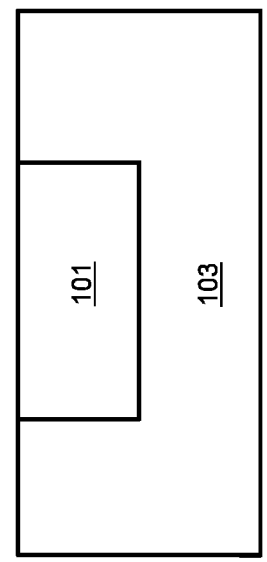
Figures 1E, 1F:
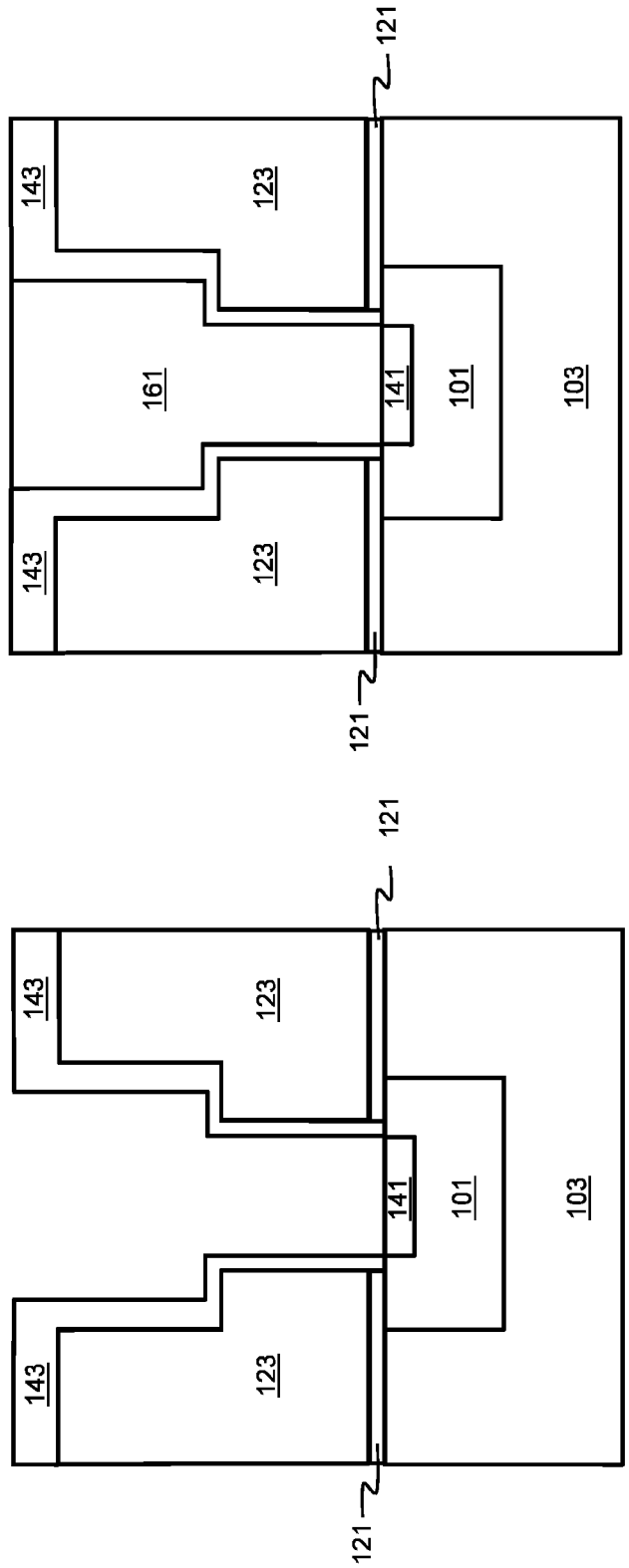
Figure 3:
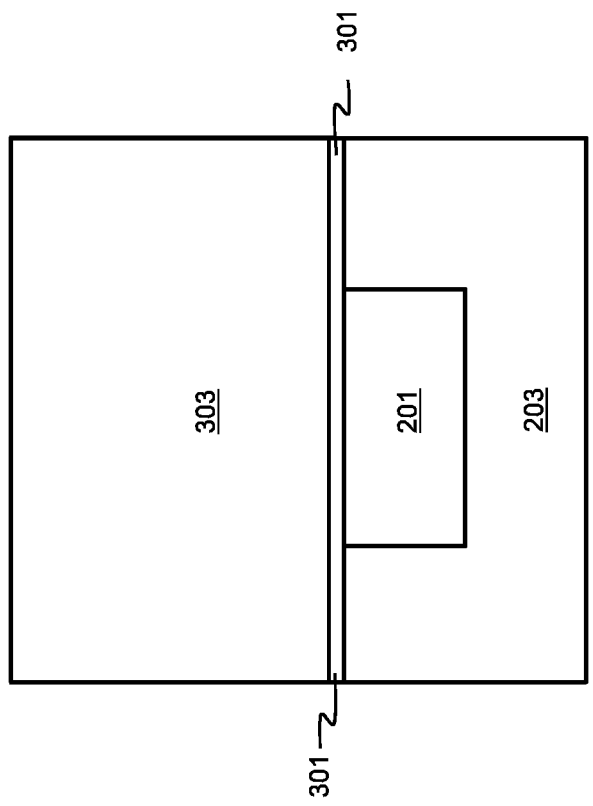
FIGS. 2 through 8 schematically illustrate sequential steps of a method of forming a dual-layer barrier of Mn/MnN in situ by an ALD process in an ALD chamber or by a CVD process in a CVD chamber, in accordance with an exemplary embodiment.
Figure 2:
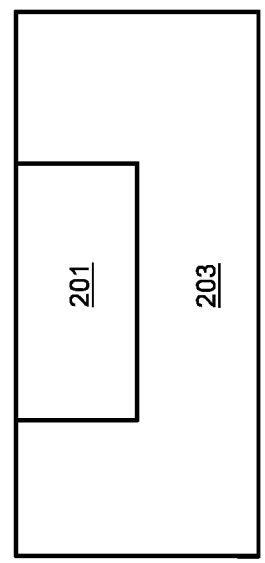

FIGS. 2 through 8 schematically illustrate sequential steps of a method of forming a dual-layer barrier of Mn/MnN in situ by an ALD process in an ALD chamber or by a CVD process, according to an exemplary embodiment. Adverting to FIG. 2, similar to the background processes discussed with respect to FIGS. 1A through 1F, a metal line 201, e.g., copper, is formed in a substrate 203. Next, a capping layer 301 of SiN, metal cap, Co, or CoWAl is formed on the metal line 201 and substrate 203, and then a Si-based insulating layer 303, e.g., SiO₂ or a ULK dielectric material, is formed on top of the capping layer 301, as illustrated in FIG. 3. Adverting to FIG. 4, a via is formed in the Si-based insulating layer 303 down to the metal line 201.

Figure 5:
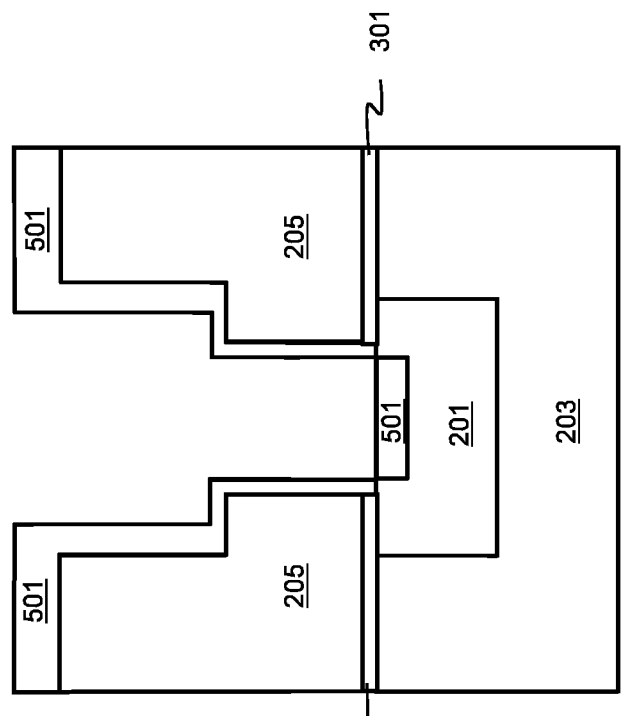
Figure 4:
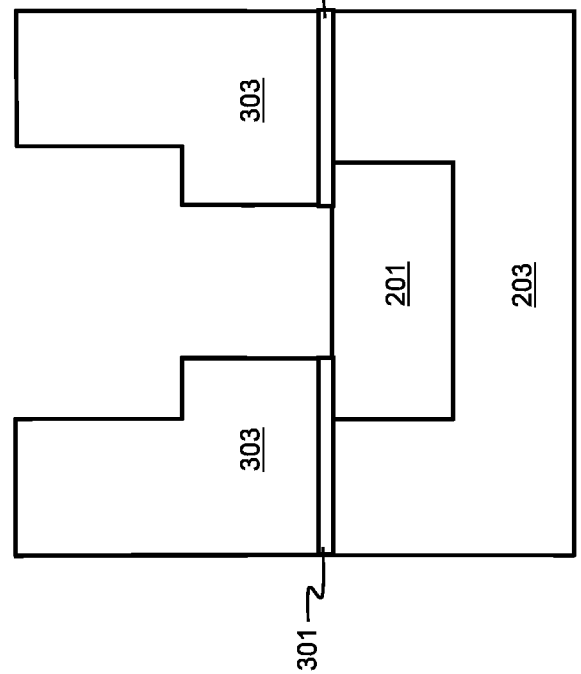
Figure 6:
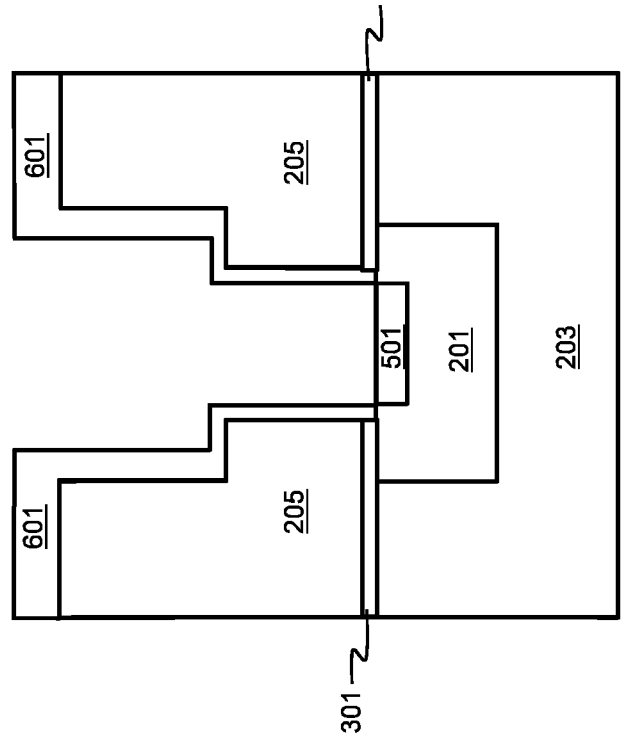

Next, a dual-layer of Mn/MnN is in the via formed by an ALD process in an ALD chamber (not shown for illustrative convenience) or by a CVD process in a CVD chamber (also not shown for illustrative convenience). The Mn layer 501 is first deposited by ALD, for example, on the sidewalls of the via (on the Si-based insulating layer 303) and on the bottom surface of the via (on the metal line 201), as depicted in FIG. 5. The Mn is deposited at a temperature of 200° C. to 450° C. and at a pressure of 0.1 Torr to 10 Torr. Consequently, the Mn layer 501 reacts with the SiO₂ or ULK dielectric material 205 at the sidewalls of the via to form a 3 Å to 30 Å layer of $MnSiO_x$ 601, as depicted in FIG. 6. Alternatively, the Mn reacts with the sidewalls of the via during a later anneal to form the $MnSiO_x$ layer 601.

Figure 7:
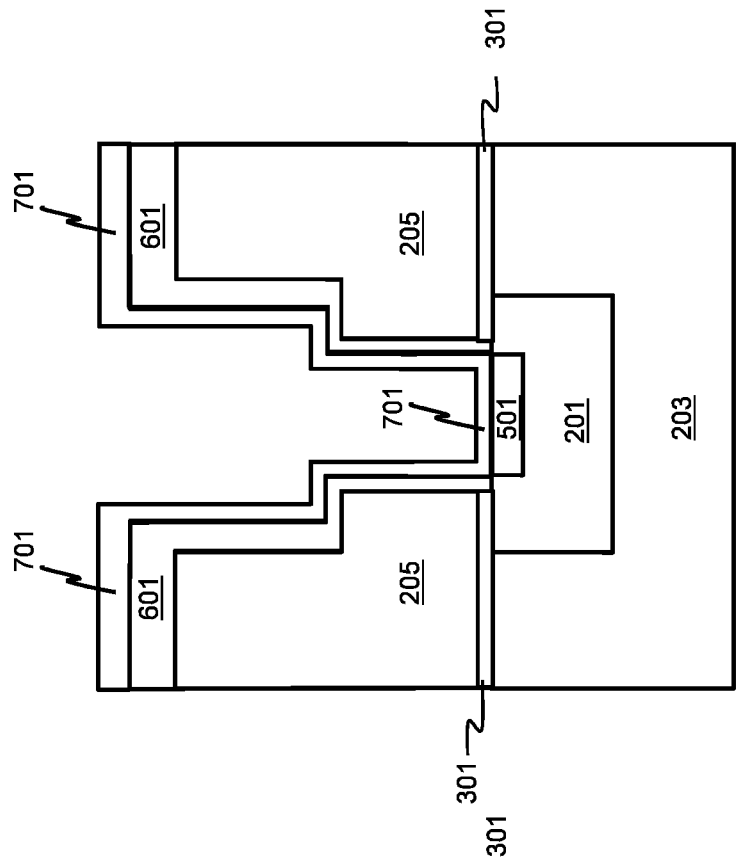
Figure 8:
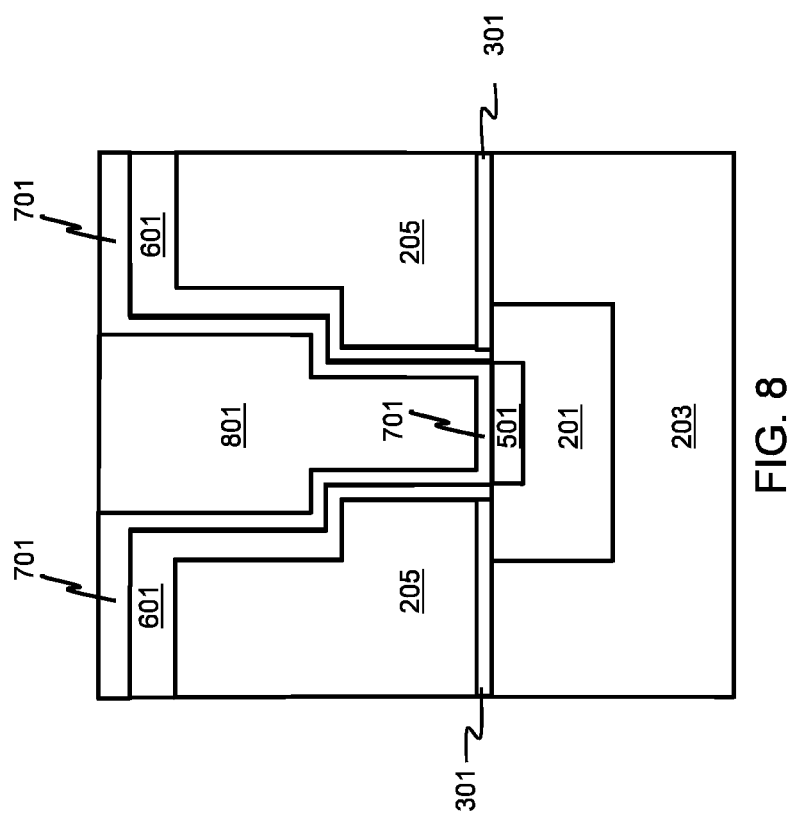

Adverting to FIG. 7, the MnN layer 701 is then deposited in situ on the $MnSiO_x$ layer 601 and Mn layer 501 to a thickness of 3 Å to 30 Å. In particular, the MnN layer 701 is formed by adding an adequate amount of N-containing gas, e.g., N₂ or ammonia (NH₃), while continuing the ALD deposition of Mn. Last, the via is filled with a metal 801, e.g., copper, as illustrated in FIG. 8.

The embodiments of the present disclosure can achieve several technical effects including improved device reliability, i.e., reducing electromigration, and a more robust barrier against diffusion of Cu and oxygen in a via. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of integrated circuits including copper interconnect structures.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
a metal line in a substrate;
a silicon-based (Si-based) insulating layer on the substrate and the metal line;
a via formed through the Si-based insulating layer down to the metal line;

a manganese (Mn) layer formed on the metal line at a bottom surface of the via;

a manganese silicate (MnSiOx) layer formed on sidewalls of the via;

a manganese nitride (MnN) layer formed on the MnSiOx and Mn layers; and a metal filling the via, wherein the Mn layer formed on the metal line at the bottom surface of the via consists of only Mn.

2. The device according to claim 1, wherein the MnSiOx layer has a thickness of 3 Å to 30 Å.

3. The device according to claim 2, wherein the MnN layer has a thickness of 3 Å to 30 Å.

4. The device according to claim 1, wherein the Si-based insulating layer comprises silicon oxide (SiO2) or an ultra-low-k (ULK) dielectric material.

5. The device according to claim 1, further comprising a capping layer on the substrate under the Si-based insulating layer.

6. The device according to claim 5, wherein the capping layer is formed of silicon nitride (SiN), metal cap, cobalt (Co), or cobalt/tungsten/aluminum (CoWAl).

7. The device according to claim 1, wherein metal filling the via comprises copper.

8. The device according to claim 1, wherein the MnSiOx barrier layer is formed by performing a thermal anneal, wherein the Mn reacts with the Si-based insulating layer at the sidewalls of the via.

9. The device according to claim 1, further comprising a capping layer over the metal line and substrate, wherein the via is formed through the capping layer.

10. A device comprising:
a metal line in a substrate;
a silicon-based (Si-based) insulating layer over the metal line and the substrate;
a metal-filled via in the Si-based insulating layer down to the metal line; and
a dual-layer of manganese (Mn)/manganese nitride (MnN) on sidewalls and a bottom surface of the via, wherein the dual layer on at least the bottom surface of the via consists of one layer of only Mn and one layer of only MnN.

11. The device according to claim 10, wherein the dual-layer is formed in situ by an atomic layer deposition (ALD) process in an ALD chamber or by a chemical vapor deposition (CVD) process in a CVD chamber.

12. The device according to claim 11, wherein the dual-layer is formed by depositing Mn in the ALD chamber; and adding nitrogen-containing (N-containing) gas to the chamber during the ALD process.

13. The device according to claim 12, wherein the N-containing gas comprises nitrogen gas (N2) or ammonia (NH3).

14. The method according to claim 12, comprising forming the dual-layer at a temperature of 200° C. to 450° C.

15. The device according to claim 12, wherein the dual-layer is formed at a pressure of 0.1 Torr to 10 Torr.

16. The device according to claim 12, wherein the Si-based insulating layer comprises silicon oxide (SiO2) or an ultra-low-k (ULK) dielectric material.

17. The device according to claim 16, wherein the MnN layer reacts with the SiO2 or ULK dielectric material at the sidewalls of the via to form manganese silicate (MnSiOx) to a thickness of 3 Å (angstroms) to 30 Å, and the Mn layer to a thickness of 3 Å to 30 Å on the MnSiOx and on the Mn layer on the bottom surface of the via.

18. A device comprising:
a metal line in a substrate;
a silicon-based (Si-based) insulating layer over the metal line and the substrate;
a via in the Si-based insulating layer down to the metal line;
manganese (Mn) on sidewalls and a bottom surface of the via formed by atomic layer deposition (ALD) in an ALD chamber or by a chemical vapor deposition (CVD) process in a CVD chamber;
a manganese nitride (MnN) layer formed to a thickness of 3 Å to 30 Å on the sidewalls and bottom surface of the via, by adding a nitrogen-containing (N-containing) gas to the ALD chamber during the ALD deposition, such that a dual layer of Mn/MnN is formed, wherein the dual layer on at least the bottom surface of the via consists of one layer of only Mn and one layer of only MnN; and
a Mn silicate (MnSiOx) barrier layer formed to a thickness of 3 Å to 30 Å by performing a thermal anneal, wherein the Mn reacts with the Si-based insulating layer at the sidewalls of the via.

19. The device according to claim 18, wherein the N-containing gas comprises nitrogen gas (N2) or ammonia (NH3).

20. The device according to claim 19, wherein the Si-based insulating layer is formed of silicon oxide (SiO2) or an ultra-low-k (ULK) dielectric material.

\* \* \* \* \*